(12) United States Patent
Kim et al.

(10) Patent No.: US 10,600,987 B2
(45) Date of Patent: Mar. 24, 2020

(54) ELECTROLUMINESCENT DISPLAY DEVICE

(71) Applicant: LG Display Co., Ltd., Seoul (KR)

(72) Inventors: Young-Ju Kim, Paju-si (KR);
Tae-Kung Ryoo, Paju-si (KR);
Young-Jun Yu, Seoul (KR);
Hyuk-Chan Gee, Seoul (KR);
Sung-Jin Park, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 33 days.

(21) Appl. No.: 15/849,370

(22) Filed: Dec. 20, 2017

(65) Prior Publication Data

US 2018/0182997 A1 Jun. 28, 2018

(30) Foreign Application Priority Data

Dec. 27, 2016 (KR) .................. 10-2016-0179870

(51) Int. Cl.
| | | |
|---|---|---|
| *H01L 51/52* | (2006.01) | |
| *H01L 51/56* | (2006.01) | |
| *H01L 27/32* | (2006.01) | |
| *H01L 51/00* | (2006.01) | |

(52) U.S. Cl.
CPC ...... *H01L 51/5234* (2013.01); *H01L 27/3248* (2013.01); *H01L 51/56* (2013.01); *H01L 27/3211* (2013.01); *H01L 27/3244* (2013.01); *H01L 51/0085* (2013.01)

(58) Field of Classification Search
CPC ............. H01L 51/0072; H01L 51/5056; H01L 51/5072; H01L 51/5092; H01L 51/5016
See application file for complete search history.

(56) References Cited

U.S. PATENT DOCUMENTS

| | | | | |
|---|---|---|---|---|
| 2013/0033173 A1* | 2/2013 | Yamauchi | ............... | C08G 61/12 313/504 |
| 2013/0328039 A1* | 12/2013 | Ohuchi | ............... | H01L 27/3244 257/40 |
| 2017/0244048 A1* | 8/2017 | Kim | ................ | C07F 9/657163 |

FOREIGN PATENT DOCUMENTS

| | | |
|---|---|---|
| CN | 101212024 A | 7/2008 |
| CN | 101358127 A | 2/2009 |
| CN | 102132438 A | 7/2011 |
| CN | 102246328 A | 11/2011 |
| CN | 102714902 A | 10/2012 |
| KR | 10-2009-0029111 A | 3/2009 |

OTHER PUBLICATIONS

Korean Patent No. 1020090029111 [machine's translation].*

* cited by examiner

*Primary Examiner* — Tony Tran
(74) *Attorney, Agent, or Firm* — Seed IP Law Group LLC (57) ABSTRACT

An electroluminescent display device includes a first electrode; a hole auxiliary layer on the first electrode; a light emitting material layer on the hole auxiliary layer; and a second electrode on the light emitting material layer, wherein the second electrode includes a first metal and further includes a second metal or metal compound having a refractive index of 1.3 or more as a dopant.

16 Claims, 11 Drawing Sheets

FIG. 1

Related Art

ELECTROLUMINESCENT DISPLAY DEVICE

CROSS-REFERENCE TO RELATED APPLICATION

The present application claims priority from and the benefit under 35 U.S.C. § 119(a) of Korean Patent Application No. 10-2016-0179870 filed on Dec. 27, 2016, which is hereby incorporated by reference in its entirety.

BACKGROUND

Technical Field

The present disclosure relates to an electroluminescent display device, and more particularly, to an electroluminescent display device capable of improving light efficiency and color properties.

Description of the Related Art

Recently, flat panel displays have been widely developed and applied to various fields because of their thin profile, light weight, and low power consumption.

Among the flat panel displays, electroluminescent display devices emit light due to the radiative recombination of an exciton after forming the exciton from an electron and a hole by injecting charges into a light emitting layer between a cathode for injecting electrons and an anode for injecting holes.

The electroluminescent display devices include a flexible substrate such as plastic; because they are self-luminous, the electroluminescent display devices have excellent contrast ratios; the electroluminescent display devices have a response time of several micro seconds, and there are advantages in displaying moving images; the electroluminescent display devices have wide viewing angles and are stable under low temperatures; since the electroluminescent display devices are driven by a low voltage of direct current (DC) 5V to 15V, it is easy to design and manufacture driving circuits; and the manufacturing processes of the electroluminescent display device are simple since only deposition and encapsulation steps are required.

Figure 1:
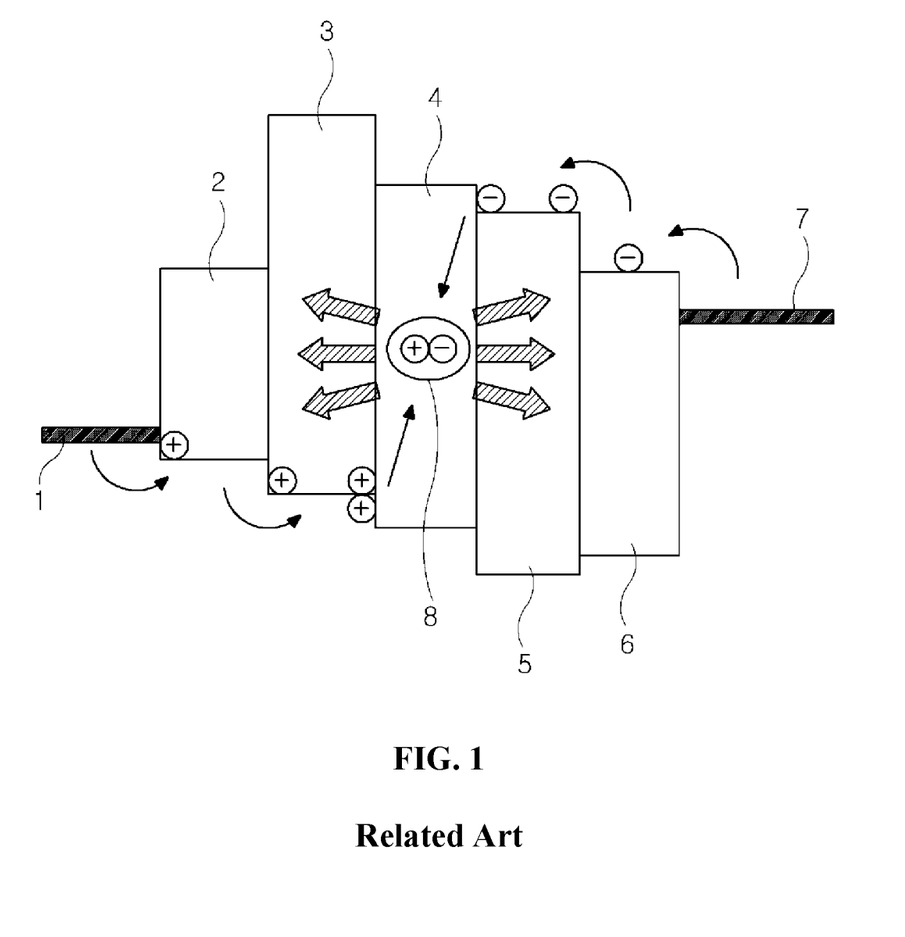
FIG. 1 is a view of illustrating a band diagram of a related art electroluminescent display device.

FIG. 1 is a view of illustrating a band diagram of a related art electroluminescent display device.

In FIG. 1, the electroluminescent display device includes an anode 1, a cathode 7 and a light emitting material layer 4 between the anode 1 and the cathode 7. A hole transporting layer (HTL) 3 is disposed between the anode 1 and the light emitting material layer 4 for injecting holes into the light emitting material layer 4, and an electron transporting layer (ETL) 5 is disposed between the cathode 7 and the light emitting material layer 4 for injecting electrodes into the light emitting material layer 4. At this time, to further efficiently inject the holes and the electrons, a hole injecting layer (HIL) 2 can be disposed between the anode 1 and the hole transporting layer 3, and an electron injecting layer (EIL) 6 can be disposed between the cathode 7 and the electron transporting layer 5.

In the electroluminescent display device having the above-mentioned structure, a hole (+) injected into the light emitting material layer 4 through the hole injecting layer 2 and the hole transporting layer 3 from the anode 1 is combined with an electron (−) injected into the light emitting material layer 4 through the electron injecting layer 6 and the electron transporting layer 5 from the cathode 7, whereby an exciton 8 is generated and light is emitted from the exciton 8. Here, the light has a color corresponding to a band gap of the light emitting material layer 4.

The electroluminescent display devices can be classified into a bottom emission type, a top emission type and a both side emission type according to an output direction of light emitted form the light emitting material layer 4. The light emitted from the light emitting material layer 4 can be outputted to the outside through the anode 1 in the bottom emission type, can be outputted to the outside through the cathode 7 in the top emission type, and can be outputted to the outside through both the anode 1 and the cathode 7.

In the electroluminescent display devices, the cathode 7 can be formed of a metallic material. The metallic material of the cathode can become diffused into the light emitting material layer 4, thereby lowering characteristics of a light emitting diode.

Namely, since the metallic material can become diffused into the light emitting material layer 4, light efficiency and color properties decrease. In addition, a driving voltage of the light emitting diode increases.

These problems can occur more severely in the top emission type and the both side emission type in which the cathode 1 is transparent.

BRIEF SUMMARY

Accordingly, the present disclosure is directed to an electroluminescent display device that substantially obviates one or more of the problems due to limitations and disadvantages of the related art.

An object of the present disclosure is to provide an electroluminescent display device having improved light efficiency and color properties.

Another object of the present disclosure is to have a lower driving voltage of an electroluminescent display device then some prior devices.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device includes a first electrode; a hole auxiliary layer on the first electrode; a light emitting material layer on the hole auxiliary layer; and a second electrode on the light emitting material layer, wherein the second electrode includes a first metal and further includes a second metal or metal compound having a refractive index of 1.3 or more as a dopant.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION

Reference will now be made in detail to embodiments of the disclosure, examples of which are illustrated in the accompanying drawings.

Figure 2:
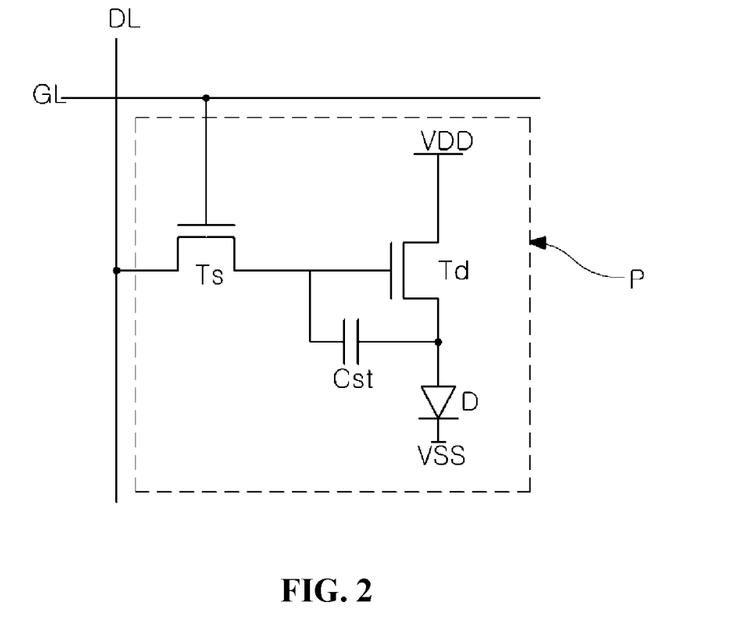
FIG. 2 is a circuit diagram of one pixel region of an electroluminescent display device according to an embodiment of the present disclosure.

FIG. 2 is a circuit diagram of one pixel region of an electroluminescent display device according to an embodiment of the present disclosure.

In FIG. 2, the electroluminescent display device according to the embodiment of the present disclosure includes a gate line GL, a data line DL, a switching thin film transistor Ts, a driving thin film transistor Td, a storage capacitor Cst and a light emitting diode D. The switching thin film transistor Ts, the driving thin film transistor Td, the storage capacitor Cst and the light emitting diode D are formed in a pixel region P.

More particularly, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light emitting diode D is connected to a drain electrode of the driving thin film transistor Td, and a cathode of the light emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied through the switching thin film transistor Ts to the gate electrode of the driving thin film transistor Td and to one electrode of the storage capacitor Cst. When the driving thin film transistor Td is turned on by the data signal, an electric current flowing through the light emitting diode D is controlled, thereby outputting light from that pixel. The light emitting diode D emits light based on to the current supplied through the driving thin film transistor Td from the high voltage supply VDD.

Namely, the amount of the current flowing through the light emitting diode D is proportional to the magnitude of the data signal, and the intensity of light emitted by the light emitting diode D is proportional to the amount of the current flowing through the light emitting diode D. There are many such pixels in a display device. Thus, each of the pixel regions P shows different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode D to be constant and the gray level shown by the light emitting diode D to be maintained until a next frame.

Figure 3:
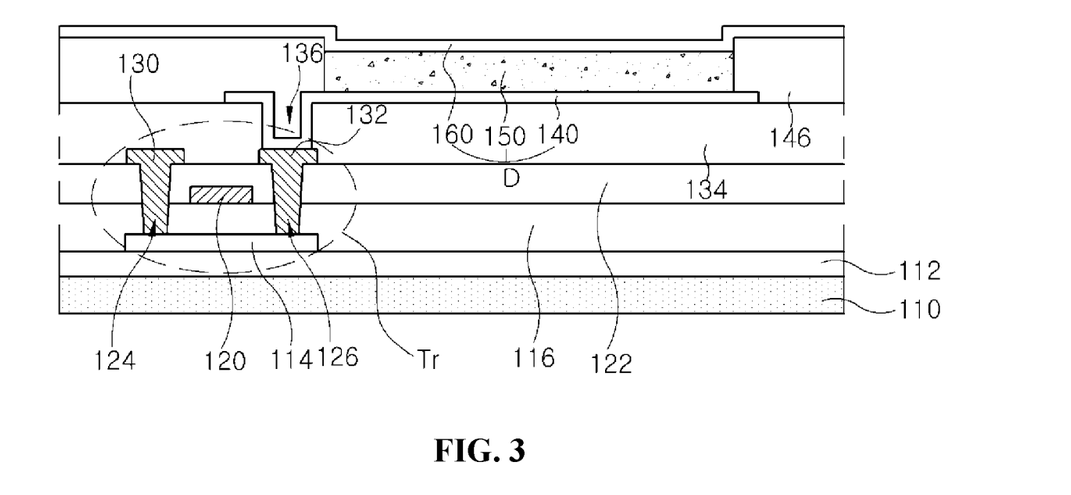
FIG. 3 is a cross-sectional view of an electroluminescent display device according to the embodiment of the present disclosure.

FIG. 3 is a cross-sectional view of an electroluminescent display device according to the embodiment of the present disclosure and shows one pixel region that corresponds to the circuit shown in FIG. 2. Not all circuit elements of FIG. 2 are shown because of the location selected for the cross-section.

As shown in FIG. 3, the electroluminescent display device according to the embodiment of the present disclosure can include a substrate 110, a thin film transistor Tr disposed on the substrate 110, and a light emitting diode D disposed on the substrate 110 and connected to the thin film transistor Tr. An encapsulation film (not shown) can be disposed on the light emitting diode D.

The substrate 110 can be a glass substrate or a flexible substrate formed of a polymer such as polyimide.

A buffer layer 112 can be formed on the substrate 110, and the thin film transistor Tr can be formed on the buffer layer 112. The buffer layer 112 can be formed of an inorganic insulating material such as silicon oxide ($SiO_2$) and silicon nitride (SiNx). The buffer layer 112 can be omitted.

A semiconductor layer 114 is formed on the buffer layer 112. The semiconductor layer 114 can be formed of an oxide semiconductor material or polycrystalline silicon. When the semiconductor layer 114 is formed of the oxide semiconductor material, a light-blocking pattern (not shown) can be formed under the semiconductor layer 114. The light-blocking pattern blocks light from being incident on the semiconductor layer 114 to prevent the semiconductor layer 114 from being degraded by the light. Alternatively, the semiconductor layer 114 can be formed of polycrystalline silicon, and in this instance, impurities can be doped in both ends of the semiconductor layer 114.

A gate insulating layer 116 of an insulating material is formed on the semiconductor layer 114. The gate insulating layer 116 can be formed of an inorganic insulating material such as silicon oxide ($SiO_2$) and silicon nitride (SiNx).

A gate electrode 120 of a conductive material such as metal can be formed on the gate insulating layer 116 to correspond to a central portion of the semiconductor layer 114.

In FIG. 3, the gate insulating layer 116 is formed over substantially all of the substrate 110. Alternatively, the gate insulating layer 116 can be patterned to have the same shape as the gate electrode 120 and is not located in other parts of the substrate.

An interlayer insulating layer 122 of an insulating material is formed on the gate electrode 120. The interlayer insulating layer 122 can be formed over substantially all of the substrate 110. The interlayer insulating layer 122 can be formed of an inorganic insulating material such as silicon oxide ($SiO_2$) and silicon nitride (SiNx) or an organic insulating material such as benzocyclobutene and photo acryl.

The interlayer insulating layer 122 includes first and second contact holes 124 and 126 exposing top surfaces of both sides of the semiconductor layer 114. The first and second contact holes 124 and 126 are spaced apart from the gate electrode 120. The gate electrode 120 can be disposed between the first and second contact holes 124 and 126.

The first and second contact holes 124 and 126 are also formed in the gate insulating layer 116. Alternatively, when the gate insulating layer 116 is patterned to have the same shape as the gate electrode 120, the first and second contact holes 124 and 126 are formed only in the interlayer insulating layer 122.

A source electrode 130 and a drain electrode 132 of a conductive material such as metal are formed on the interlayer insulating layer 122.

The source and drain electrodes 130 and 132 are spaced apart from each other with respect to the gate electrode 120. The source and drain electrodes 130 and 132 contact both sides of the semiconductor layer 114 through the first and second contact holes 124 and 126, respectively.

In the electroluminescent display device, a thin film transistor Tr includes the semiconductor layer 114, the gate electrode 120, the source electrode 130 and the drain electrode 132. The thin film transistor Tr functions as a driving element and corresponds to the driving thin film transistor Td of FIG. 2.

The thin film transistor Tr can have a coplanar structure where the gate electrode 120 and the source and drain electrodes 130 and 132 are disposed at one side of the semiconductor layer 114, over the semiconductor layer 114.

Alternatively, the thin film transistor Tr can have an inverted staggered structure where the gate electrode is disposed under the semiconductor layer and the source and drain electrodes are disposed over the semiconductor layer. In this instance, the semiconductor layer can be formed of amorphous silicon.

Although not shown in FIG. 3, a gate line and a data line A are also present within a pixel region, and a switching element is connected to the gate line and the data line. The switching element can correspond to transistor Ts of FIG. 2 and is also connected to the thin film transistor Tr of the driving element. The switching element can have the same structure as the thin film transistor Tr.

In addition, a power line can be further formed in parallel to and apart from the gate line or the data line, and a storage capacitor can be further formed to constantly maintain a voltage at the gate electrode of the thin film transistor Tr during one frame.

A passivation layer 134 is formed on the source and drain electrodes 130 and 132. The passivation layer 134 can be formed over substantially all of the substrate 110. The passivation layer 134 covers the thin film transistor Tr and has a drain contact hole 136 exposing the drain electrode 132. The passivation layer 134 can be formed of an inorganic insulating material such as silicon oxide ($SiO_2$) and silicon nitride (SiNx) or an organic insulating material such as benzocyclobutene and photo acryl. The passivation layer 134 can have a flat top surface.

In FIG. 3, although the drain contact hole 136 is formed directly over the second contact hole 126, the drain contact hole 136 can be spaced apart from the second contact hole 126.

A first electrode 140 is formed on the passivation layer 134 and is connected to the drain electrode 132 of the thin film transistor Tr through the drain contact hole 136. The first electrode 140 is separately disposed in each pixel region. The first electrode 140 can be an anode and can be formed of a conductive material having a relatively high work function. For example, the first electrode 140 can be formed of a transparent conductive material such as indium tin oxide (ITO) and indium zinc oxide (IZO) for a bottom emission type of device.

On the other hand, when the electroluminescent display device is a top emission type, the first electrode can be an opaque metal, such as Al, Cu, Mg, Ag or the like. Alternatively, a reflection electrode or a reflection layer can be further formed as part of or under the first electrode 140. For example, the reflection electrode or the reflection layer can be formed of aluminum-palladium-copper (APC) alloy.

A bank layer 146 is formed on the first electrode 140 and the passivation layer 134. The bank layer 146 covers edges of the first electrode 140. The bank layer 146 exposes a central portion of the first electrode 140 corresponding to the pixel region.

A light emitting layer 150 is formed on the first electrode 140 exposed by the bank layer 146. A structure of the light emitting layer 150 will be described in detail later.

A second electrode 160 is formed over the substrate 110 on which the light emitting layer 150 is formed. The second electrode 160 can be formed over substantially all of a display area. The second electrode 160 can be formed of a conductive material having relatively low work function and can serve as a cathode. At this time, the second electrode 160 can have a relatively thin thickness such that light passes therethrough.

Here, the second electrode 160 can include a first metal and further include a second metal or metal compound having relatively high refractive index that is present in the first metal as a dopant. For example, in a bottom emission device, the first metal can be, but not limited to this, aluminum (Al), magnesium (Mg), silver (Ag) or an alloy of any of the these metals. In addition, it is beneficial that the second metal or metal compound has the refractive index of 1.3 or more. The term, metal material is used herein having the broad meaning to include any material that contains a metal. It can be a pure metal, such as lithium, cesium, copper, aluminium, silver alloy thereof and it also include metal compounds within its meaning. The term metal as used herein is an item composed solely of metal. A metal compound as used herein means a molecule that contains at least one metal atom of a first type of metal as part of the molecule and another atom of a different element than first metal in the same molecule. The second element might or might not be a metal. A metal/nonmetal compound is a subset of the metal compound and is more specific to be limited to a compound in which at least one of the elements in the molecule is not a metal. For instance, the metal material can be, but not limited to this, lithium fluoride (LiF), cesium fluoride (CsF), sodium fluoride (NaF) or barium (Ba). The first three of these listed are also metal compounds and they also belong to the group within the metal compounds of a metal/nonmetal compound. Barium, on the other hand is a metal material that is just metal and is not a compound. In summary, the term metal material is the broad term and the terms metal, metal alloy, metal compound and metal/nonmetal compound are subsets within this group.

The first electrode 140, the light emitting layer 150 and the second electrode 160 constitute a light emitting diode D.

Figure 4:
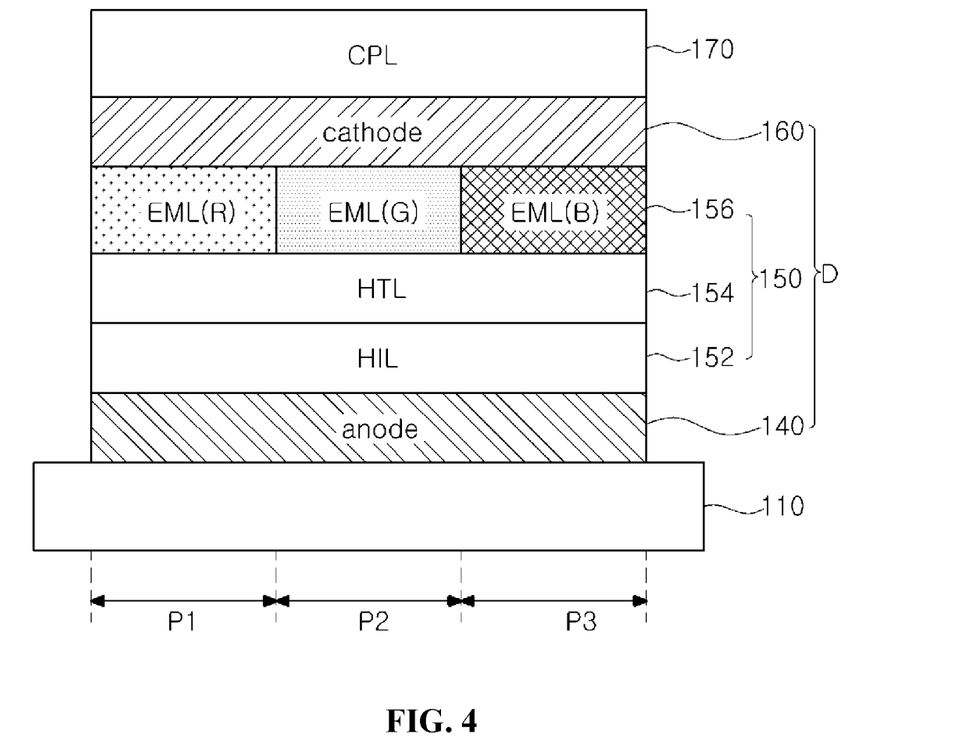
FIG. 4 is a schematic cross-sectional view of an electroluminescent display device according to the embodiment of the present disclosure.

FIG. 4 is a schematic cross-sectional view of one example of an electroluminescent display device according to one embodiment of the present disclosure.

In FIG. 4, first, second and third pixel regions, i.e., red, green and blue pixel regions P1, P2 and P3 are defined on a substrate 110. A light emitting diode D is disposed in each pixel region P1, P2 and P3. The light emitting diode D includes a first electrode 140, a light emitting layer 150 and a second electrode 160. The light emitting layer 150 includes a hole injecting layer (HIL) 152, a hole transporting layer (HTL) 154, and a light emitting material layer 156.

More particularly, the first electrode 140 is formed in each of the red, green and blue pixel regions P1, P2 and P3 as an anode. In the figure, although the first electrodes 140 in the red, green and blue pixel regions P1, P2 and P3 are connected to each other, the first electrodes 140 in the red, green and blue pixel regions P1, P2 and P3 are separated from each other.

The first electrode 140 can be formed of a transparent conductive material such as indium tin oxide (ITO) and indium zinc oxide (IZO). In some embodiments, the electrode 140 can be a reflection electrode or a reflection layer can be further formed under the first electrode 140. For example, the reflection electrode or the reflection layer can be formed of aluminum-palladium-copper (APC) alloy.

The hole injecting layer 152 is formed on the first electrode 140. The hole injecting layer 152 can be separated by the red, green and blue pixel regions P1, P2 and P3. At this time, the hole injecting layers 152 in the red, green and blue pixel regions P1, P2 and P3 can have different thicknesses. Alternatively, the hole injecting layer 152 in one pixel region P1, P2 and P3 can be connected to another hole injecting layer 152 in a next pixel region P1, P2 and P3 to form one body.

The hole transporting layer 154 is formed on the hole injecting layer 152. The hole transporting layer 154 can be separated by the red, green and blue pixel regions P1, P2 and P3. At this time, the hole transporting layer 154 in the red, green and blue pixel regions P1, P2 and P3 can have different thicknesses.

Alternatively, the hole transporting layer 154 in one pixel region P1, P2 and P3 can be connected to another hole transporting layer 154 in a next pixel region P1, P2 and P3 to form one body.

The hole injecting layer 152 and the hole transporting layer 154 constitute a hole auxiliary layer. One of hole injecting layer 152 and the hole transporting layer 154 can be omitted.

The light emitting material layer 156 is formed on the hole transporting layer 154. The light emitting material layer 156 can be formed of an organic light emitting material. Alternatively, the light emitting material layer 156 can be formed of an inorganic light emitting material that contains quantum dots.

The light emitting material layer 156 includes a red light emitting material layer EML(R), a green light emitting material layer EML(G) and a blue light emitting material layer EML(B) corresponding to the red, green and blue pixel regions P1, P2 and P3, respectively.

The hole injecting layer 152, the hole transporting layer 154 and the light emitting material layer 156 can be formed through a vacuum thermal evaporation process. Alternatively, the hole injecting layer 152, the hole transporting layer 154 and the light emitting material layer 156 can be formed through a solution process. For example, an inkjet printing method or a spin coating method can be used for the solution process.

The second electrode 160 is formed on the light emitting material layer 156 as a cathode. The second electrode 160 can be formed through a deposition process. The second electrode 160 in one pixel region P1, P2 and P3 can be connected to another second electrode 160 in a next pixel region P1, P2 and P3 to form one body. The second electrode 160 can be formed over substantially all of the substrate 110.

In one embodiment, light emitted from the light emitting material layer 156 can be outputted to the outside through the second electrode 160. The second electrode 160 can have a relatively thin thickness such that the light emitted from the light emitting material layer 156 passes therethrough. The thickness of the second electrode 160 can be less than 20 nm, and beneficially, less than 10 nm.

The second electrode 160 includes a first metal and is doped with a second metal material. This second metal material can be a metal or metal compound having relatively high refractive index. In one embodiment, it is beneficial that the second metal material have the refractive index of 1.3 or more. In addition, the second metal material beneficially, has a LUMO (lowest unoccupied molecular orbital) value less than −2.5 eV. In one embodiment, the second metal material can have an index of refraction above 1.5, for example, the range of the index of refraction for the second metal material is between 1.5 and 2.0. In another embodiment, the refractive index of the second metal material is less than 1.5. In yet a further embodiment, the index of refraction is preferably between 1.3 and 1.4.

The first metal can be, but not limited to this, aluminum (Al), magnesium (Mg), silver (Ag) or their alloy. For instance, the first metal can be formed of an alloy of magnesium and silver (Mg:Ag). At this time, the content of silver can be equal to or more than the content of magnesium. As the content of silver increases, the transmittance of the second electrode 160 increases, and the light efficiency is improved. Here, it is beneficial that the content ratio of magnesium and silver is within a range of 1:1 to 1:5.

Moreover, the second metal material can be, but not limited to this, lithium fluoride (LiF), cesium fluoride (CsF), sodium fluoride (NaF) or barium (Ba).

At this time, the content of the second metal material compound can be 2% to 10% of the content of the first metal, and beneficially, 2% to 5% of the content of the first metal by weight. Namely, of the total weight of the cathode, between 90% to 98%, inclusive, is comprised of the first metal and between 2% and 10%, inclusive, is comprised of the second metal material. The second metal material is provided in the first metal as a dopant.

As stated above, the first electrode 140, the light emitting layer 150 and the second electrode 160 constitute the light emitting diode D.

To improve the light efficiency, the light emitting diode D in each of the red, green and blue pixel regions P1, P2 and P3 can have a predetermined thickness considering the microcavity effect. Therefore, the light emitting diodes D in the red, green and blue pixel regions P1, P2 and P3 can have different thicknesses from each other. At this time, the light emitting diodes D in the red, green and blue pixel regions P1, P2 and P3 can have thicknesses corresponding to a first order cavity condition or a second order cavity condition. For example, the light emitting diodes D in the red and green pixel regions P1 and P2 can have thicknesses corresponding to the first order cavity condition, and the light emitting diode D in the blue pixel region P3 can have a thickness corresponding to the second order cavity condition.

In the meantime, a capping layer 170 is formed on the second electrode 160. The capping layer 170 can be formed over substantially all of the substrate 110 like the second electrode 170. The capping layer 170 can be formed of an organic material having relatively high refractive index. The wavelength of light moving along the capping layer 170 is amplified by the surface plasma resonance, and thus the intensity of the peak is increased, thereby improving the light efficiency in the top emission type electroluminescent display device.

Light emitting diodes were manufactured according to the embodiment of the present disclosure and comparative examples. The light emitting diodes according to the embodiment of the present disclosure and the comparative examples are blue light emitting diodes.

Embodiment (EMB)

An ITO substrate having a sheet resistance of 30 Ω/sq, a thickness of 1.08 mm and a light transmittance of 80% or more was cut into a size of 2 cm×2 cm, and then its surface was treated by partially removing an ITO layer using an etchant. In addition, the ITO substrate was washed with an ultrasonic cleaner for 15 minutes each in the order of acetone, methanol and isopropyl alcohol (IPA), washed with ionized water, and annealed at 230° C. for 30 minutes to be dried.

Next, a hole injecting layer (HIL) of 40 nm was formed on an anode of ITO through a solution process using TAPC (4,4'-Cyclohexylidene bis [N,N-Bis(4-methyl phenyl) benzenamine]), and a hole transporting layer (HTL) of 40 nm was formed on the hole injecting layer (HIL) through a solution process using NPD (4,4'-bis[N-naphthyl-N-Phenyl-amino]-biphenyl).

Next, a blue light emitting material layer EML(B) of 60 nm was formed on the hole transporting layer HTL. At this time, the blue light emitting material layer EML(B) included TCTA(N,N'-dicarbazolyl-3,5-benzene,4,4',4"-tris(N-carbazolyl)triphenylamine):TmPyPb(1,3,5-tri(m-pyrid-3-yl-phenyl)benzene) as a host and Firpic as a dopant. The doping content of Firpic was 10%.

Then, a cathode was formed on the blue light emitting material layer EML(B). At this time, the cathode of 20 nm was formed by depositing a 1:1 ratio of Mg:Ag doped with 3% NaF.

Here, the refractive index of NaF was 1.425, and the LUMO value of NaF was −2.8 eV.

Next, a capping layer of 20 nm was formed on the cathode by depositing TAPC(1,1-bis[(di-4-tolylamino)phenyl]cyclohexane).

COMPARATIVE EXAMPLE 1 (COM1)

In comparative example 1, a hole injecting layer HIL, a hole transporting layer HTL, and a blue light emitting material layer EML(B) were formed on an anode in the same manner as in the previous embodiment.

Next, a cathode of 20 nm was formed on the blue light emitting material layer EML(B) by depositing Mg:Ag at the ratio of 1:1.

Then, a capping layer CPL of 20 nm was formed on the cathode by depositing TAPC(1,1-bis[(di-4-tolylamino)phenyl]cyclohexane).

COMPARATIVE EXAMPLE 2 (COM2)

In comparative example 2, a hole injecting layer HIL, a hole transporting layer HTL, and a blue light emitting material layer EML(B) were formed on an anode in the same manner as in the previous embodiment.

Next, an electron injecting layer EIL of 20 nm was formed on the blue light emitting material layer EML(B) by depositing NaF.

Then, a cathode of 20 nm was formed on the electron injecting layer EIL by depositing Mg:Ag at the ratio of 1:1.

Then, a capping layer CPL of 20 nm was formed on the cathode by depositing TAPC(1,1-bis[(di-4-tolylamino)phenyl]cyclohexane).

Figure 5:
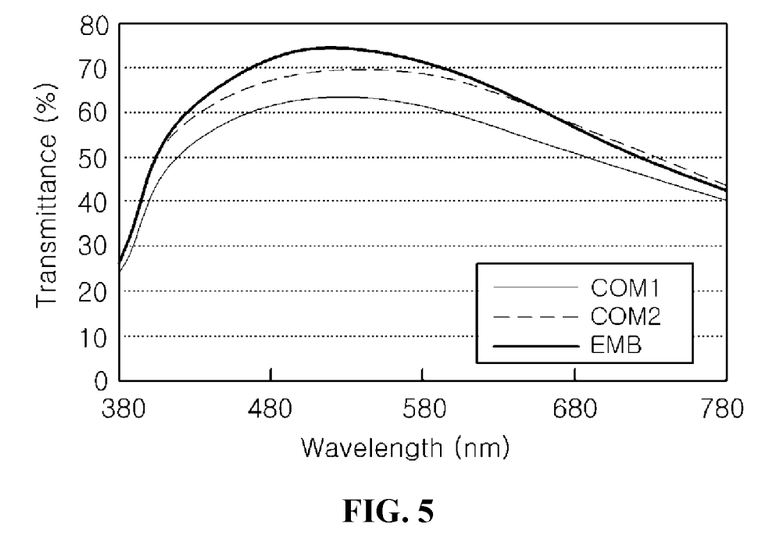
FIG. 5 is a graph illustrating transmittance characteristics of the light emitting diode according to the embodiment of the present disclosure.
Figure 6:
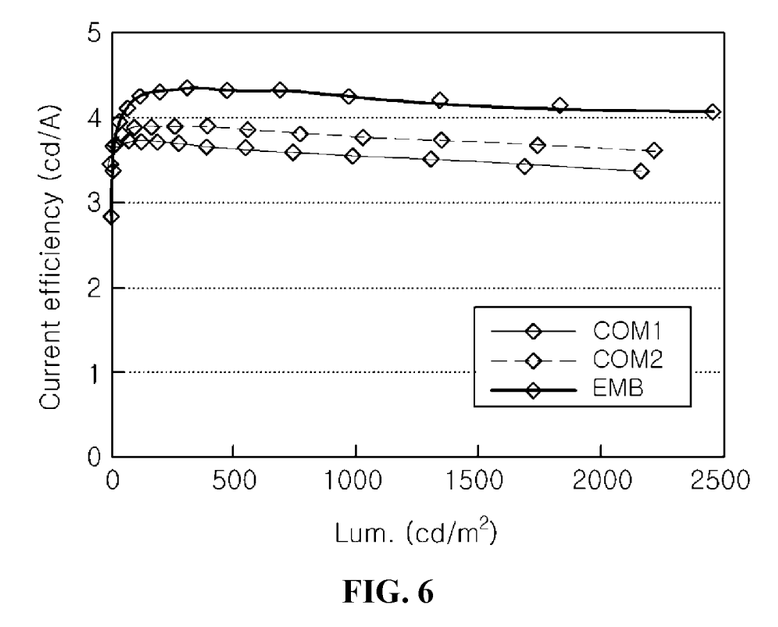
FIG. 6 is a graph illustrating luminous efficiency characteristics of the light emitting diode according to the embodiment of the present disclosure.
Figure 7:
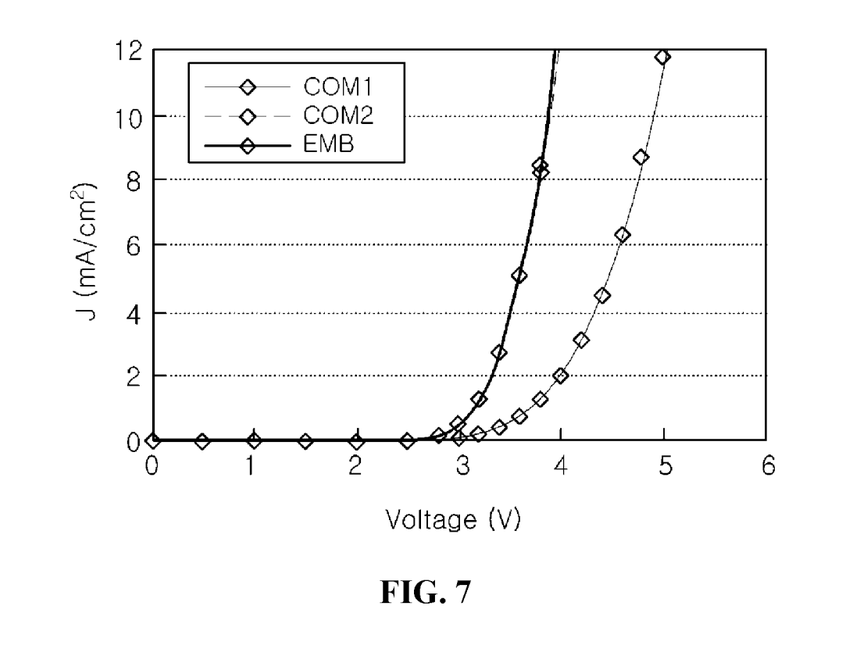
FIG. 7 is a graph illustrating voltage characteristics of the light emitting diode according to the embodiment of the present disclosure.
Figure 8:
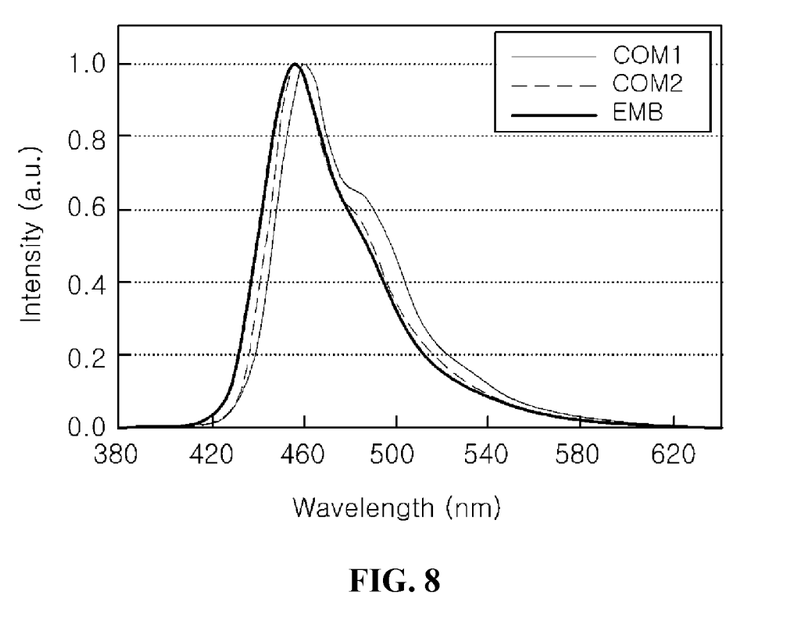
FIG. 8 is a graph illustrating spectral characteristics of the light emitting diode according to the exemplary embodiment of the present disclosure.

FIGS. 5 to 8 are graphs showing characteristics of a light emitting diode according to the embodiment of the present disclosure, together with characteristics of comparative examples. The comparative examples discussed herein are not admitted as being prior art. FIG. 5 is a graph illustrating transmittance characteristics of the light emitting diode according to the embodiment of the present disclosure. FIG. 6 is a graph illustrating luminous efficiency characteristics of the light emitting diode according to the embodiment of the present disclosure. FIG. 7 is a graph illustrating voltage characteristics of the light emitting diode according to the embodiment of the present disclosure. FIG. 8 is a graph illustrating spectral characteristics of the light emitting diode according to the exemplary embodiment of the present disclosure.

As shown in FIGS. 5 to 8, the characteristics of the light emitting diode according to the embodiment of the present disclosure are superior to those of the comparative examples 1 and 2.

More particularly, in FIG. 5, the maximum transmittance of the light emitting diode according to the embodiment of the present disclosure is 75%. On the other hand, the maximum transmittance of the comparative example 1 is 64%, and the maximum transmittance of the comparative example 2 is 71%.

Additionally, in FIG. 6, the average current efficiency of the light emitting diode according to the embodiment of the present disclosure is 4.2 cd/A. On the other hand, the average current efficiency of the comparative example 1 is 3.4 cd/A, and the average current efficiency of the comparative example 2 is 3.9 cd/A.

Moreover, in FIG. 7, the driving voltage of the light emitting diode according to the embodiment of the present disclosure is 4.0 V. On the other hand, the driving voltage of the comparative example 1 is 5.8 V, and the driving voltage of the comparative example 2 is 4.1 V.

Furthermore, in FIG. 8, the blue y-coordinate of the light emitting diode according to the embodiment of the present disclosure is 0.124. On the other hand, the blue y-coordinate of the comparative example 1 is 0.169, and the blue y-coordinate of the comparative example 2 is 0.140.

As described above, in the embodiment of the present disclosure, the second electrode is formed as the cathode by doping the first metal with a second metal or metal compound having the refractive index of 1.3 or more in the first metal, whereby the electron injection characteristics of the light emitting diode can be improved. Thus, it can be seen that the transmittance is increased, the light efficiency is improved, the driving voltage is decreased, and the color coordinates are improved.

In addition, the structure of the light emitting diode can be simplified by omitting the electron transporting layer and the electron injecting layer, thereby reducing the manufacturing process and costs.

Meanwhile, the characteristics of the light emitting diode according to the embodiment of the present disclosure are varied according to the thickness of the second electrode as the cathode. The characteristics of examples depending on the thickness of the second electrode will be described hereinafter.

(1) EXPERIMENTAL EXAMPLE 1 (EXP1)

A cathode of 10 nm was formed by depositing a 1:1 ratio of Mg:Ag doped with 2% NaF.

(2) EXPERIMENTAL EXAMPLE 2 (EXP2)

A cathode of 20 nm was formed by depositing a 1:1 ratio of Mg:Ag doped with 2% NaF.

(3) EXPERIMENTAL EXAMPLE 3 (EXP3)

A cathode of 30 nm was formed by depositing a 1:1 ratio of Mg:Ag doped with 2% NaF.

Figure 9:
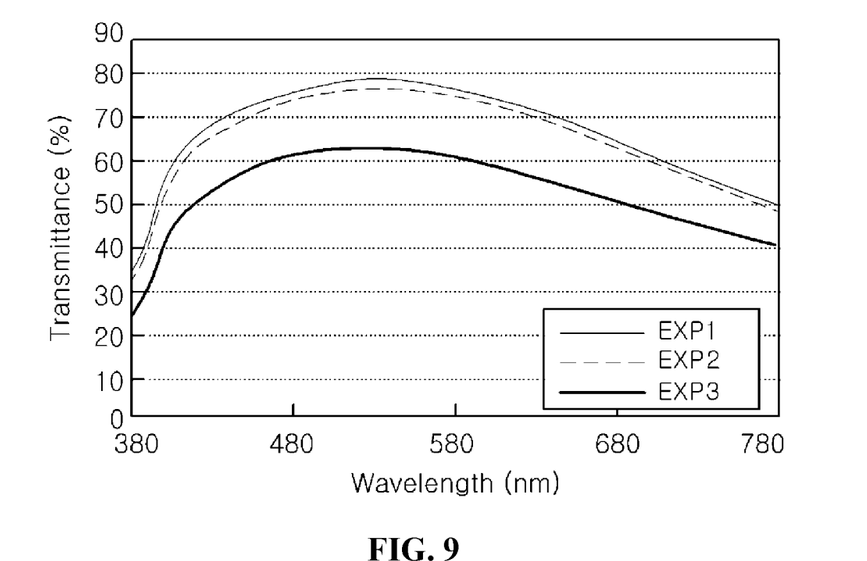
FIG. 9 is a graph illustrating transmittance characteristics of the light emitting diodes of the experimental examples according to the embodiment of the present disclosure.
Figure 10:
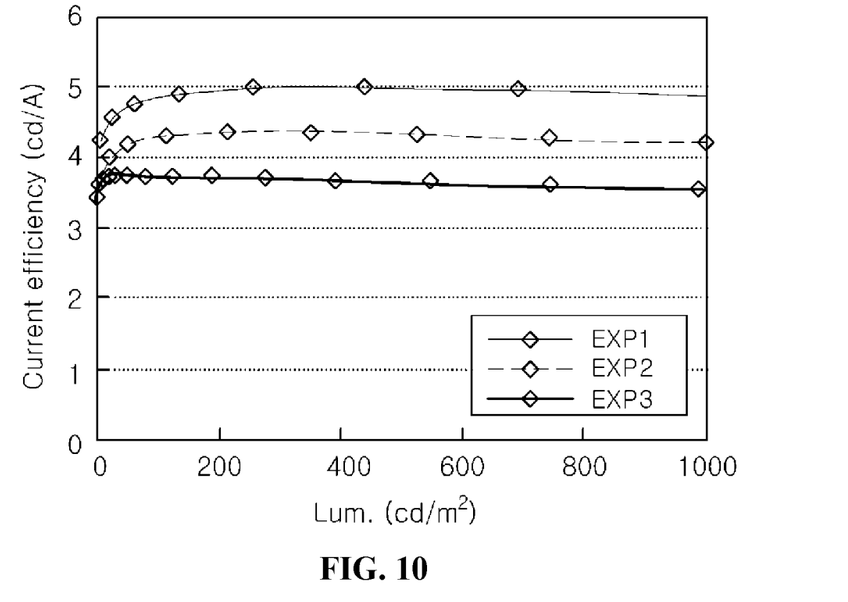
FIG. 10 is a graph illustrating luminous efficiency characteristics of the light emitting diodes of the experimental examples according to the embodiment of the present disclosure.
Figure 11:
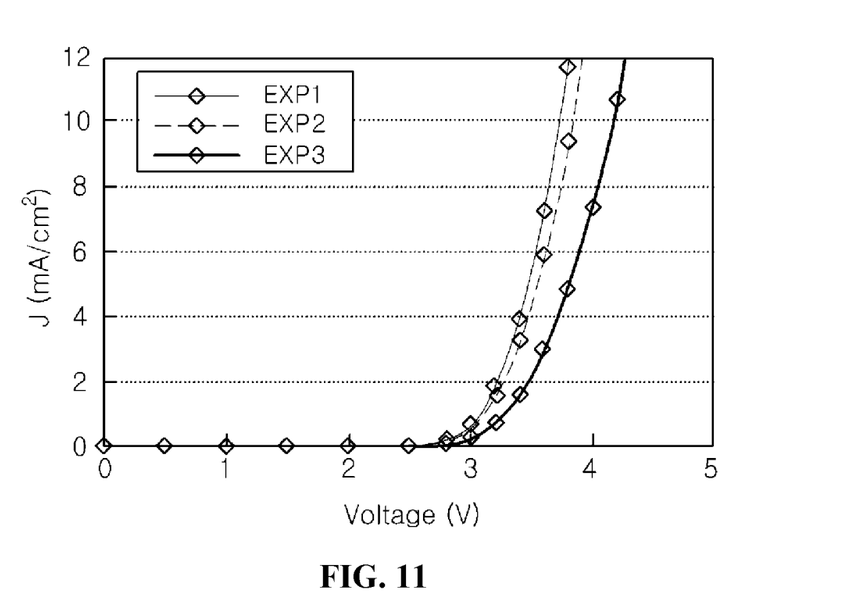
FIG. 11 is a graph illustrating voltage characteristics of the light emitting diodes of the experimental examples according to the embodiment of the present disclosure.
Figure 12:
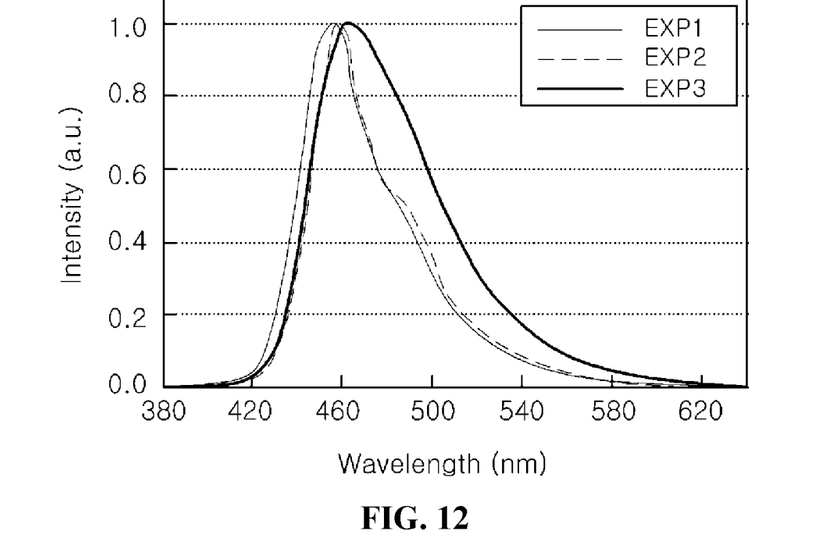
FIG. 12 is a graph illustrating spectral characteristics of the light emitting diodes of the experimental examples according to the embodiment of the present disclosure.

FIGS. 9 to 12 show characteristics of light emitting diodes of experimental examples according to the embodiment of the present disclosure. FIG. 9 is a graph illustrating transmittance characteristics of the light emitting diodes of the experimental examples according to the embodiment of the present disclosure. FIG. 10 is a graph illustrating luminous efficiency characteristics of the light emitting diodes of the experimental examples according to the embodiment of the present disclosure. FIG. 11 is a graph illustrating voltage characteristics of the light emitting diodes of the experimental examples according to the embodiment of the present disclosure. FIG. 12 is a graph illustrating spectral characteristics of the light emitting diodes of the experimental examples according to the embodiment of the present disclosure.

As shown in FIGS. 9 to 12, the characteristics of the light emitting diode according to the embodiment of the present disclosure are improved as the thickness of the second electrode, which is a cathode, is decreased.

More particularly, in FIG. 9, the maximum transmittance of Experimental Example 1 is 80%, the maximum transmittance of Experimental Example 2 is 78%, and the maximum transmittance of Experimental Example 3 is 64%.

Additionally, in FIG. 10, the average current efficiency of the light emitting diode of Experimental Example 1 is 4.8 cd/A, the average current efficiency of Experimental Example 2 is 4.2 cd/A, and the average current efficiency of Experimental Example 3 is 3.5 cd/A.

Moreover, in FIG. 11, the driving voltage of the light emitting diode of Experimental Example 1 is 3.8 V, the driving voltage of Experimental Example 2 is 4.0 V, and the driving voltage of Experimental Example 3 is 4.5 V. Thus, a lower driving voltage can be used with a thinner cathode.

Furthermore, in FIG. 12, the blue y-coordinate of the light emitting diode of Experimental Example 1 is 0.114, the blue y-coordinate of Experimental Example 2 is 0.120, and the blue y-coordinate of Experimental Example 3 is 0.212.

As described above, it can be seen that the transmittance, the luminous efficiency, the driving voltage and the color coordinates are improved as the thickness of the second electrode of the cathode is reduced.

Here, the thickness of the second electrode is preferably 20 nm or less, more preferably 10 nm or less.

Hereinafter, characteristics of the light emitting diode according to the doping concentration will be described when the thickness of the second electrode is 20 nm.

(1) EXPERIMENTAL EXAMPLE 2 (EXP2)

As mentioned above, the cathode of 20 nm was formed by depositing a 1:1 ratio of Mg:Ag doped with 2% NaF.

(2) EXPERIMENTAL EXAMPLE 2A (EXP2A)

A cathode of 20 nm was formed by depositing a 1:1 ratio of Mg:Ag doped with 3% NaF.

(3) EXPERIMENTAL EXAMPLE 2B (EXP2B)

A cathode of 20 nm was formed by depositing a 1:1 ratio of Mg:Ag doped with 5% NaF.

(4) EXPERIMENTAL EXAMPLE 2C (EXP2C)

A cathode of 20 nm was formed by depositing a 1:1 ratio of Mg:Ag doped with 7% NaF.

(5) EXPERIMENTAL EXAMPLE 2D (EXP2D)

A cathode of 20 nm was formed by depositing a 1:1 ratio of Mg:Ag doped with 10% NaF.

Figure 13:
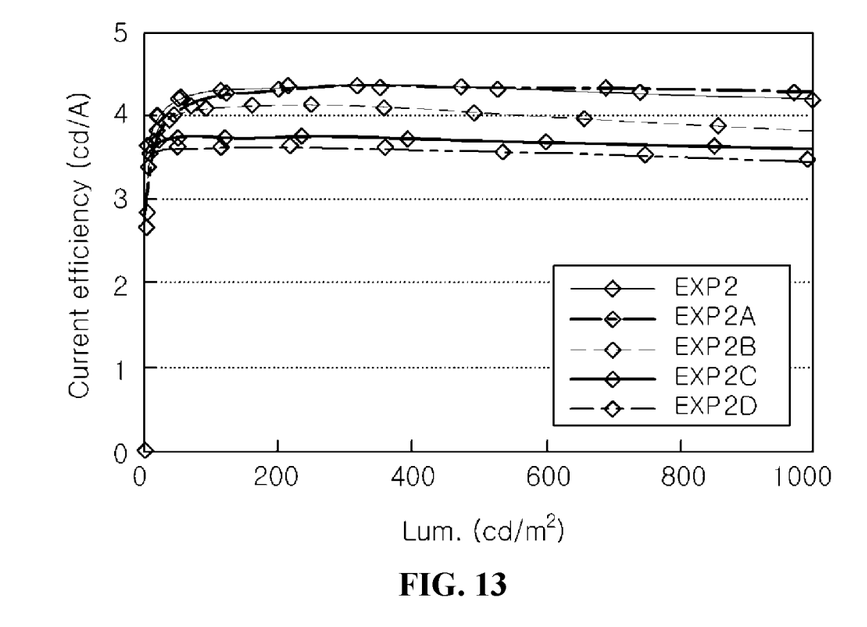
FIG. 13 is a graph illustrating the luminous efficiency characteristics of the light emitting diodes of Experimental Example 2 of the present disclosure according to the doping concentration.
Figure 14:
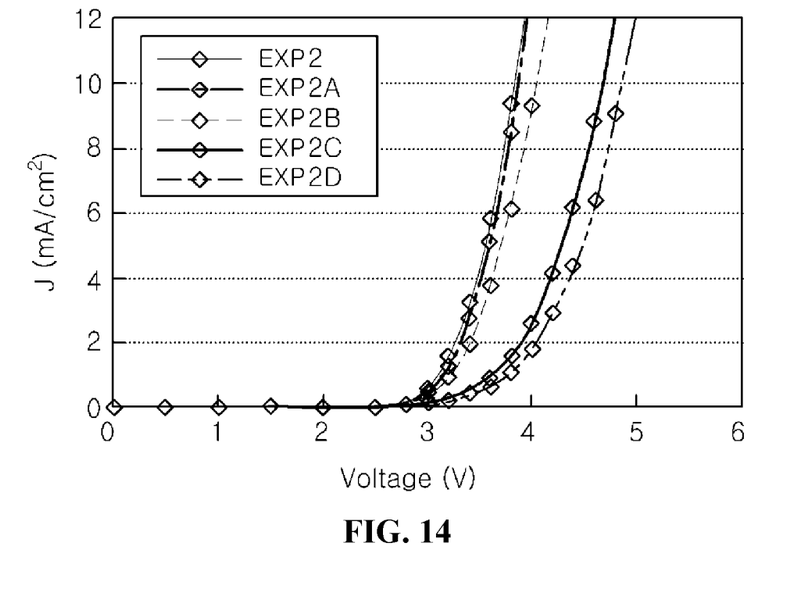
FIG. 14 is a graph illustrating voltage characteristics of the light emitting diodes of Experimental Example 2 according to the doping concentration.
Figure 15:
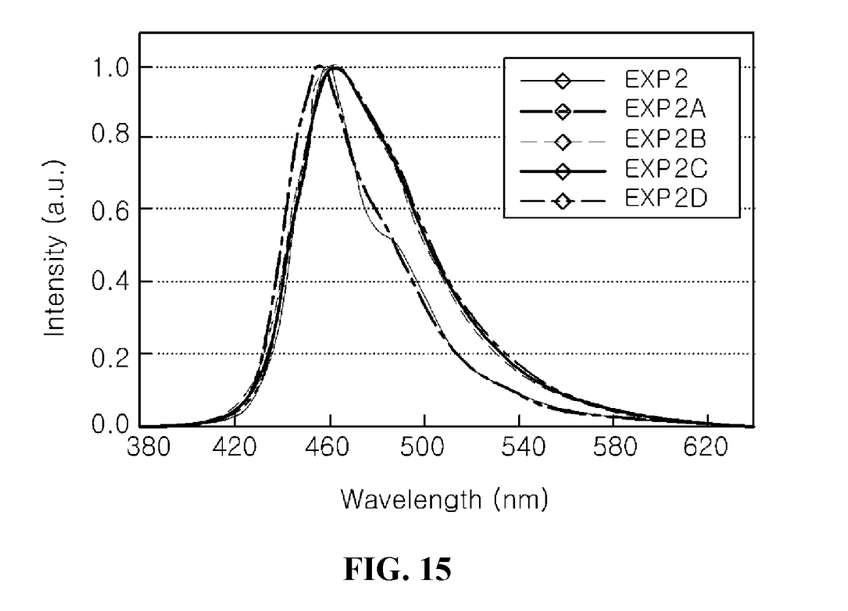
FIG. 15 is a graph illustrating the spectral characteristics of the light emitting diodes of Experimental Example 2 of the present disclosure according to the doping concentration.

FIGS. 13 to 15 show characteristics of light emitting diodes of Experimental Example 2 of the present disclosure according to the doping concentration. FIG. 13 is a graph illustrating the luminous efficiency characteristics of the light emitting diodes of Experimental Example 2 of the present disclosure according to the doping concentration. FIG. 14 is a graph illustrating voltage characteristics of the light emitting diodes of Experimental Example 2 according to the doping concentration. FIG. 15 is a graph illustrating the spectral characteristics of the light emitting diodes of Experimental Example 2 of the present disclosure according to the doping concentration.

As shown in FIG. 13, the average current efficiency of the light emitting diode of Experimental Example 2 is 4.2 cd/A, the average current efficiency of Experimental Example 2A is 4.2 cd/A, the average current efficiency of Experimental Example 2B is 3.8 cd/A, the average current efficiency of Experimental Example 2C is 3.6 cd/A, and the average current efficiency of Experimental Example 2D is 3.5 cd/A.

Additionally, in FIG. 14, the driving voltage of the light emitting diode of Experimental Example 2 is 4.0 V, the driving voltage of Experimental Example 2A is 4.0 V, the driving voltage of Experimental Example 2B is 4.2 V, the driving voltage of Experimental Example 2C is 4.8 V, and the driving voltage of Experimental Example 2D is 5.0 V.

Moreover, in FIG. 15, the blue y-coordinate of the light emitting diode of Experimental Example 2 is 0.120, the blue y-coordinate of Experimental Example 2A is 0.124, the blue y-coordinate of Experimental Example 2B is 0.170, the blue y-coordinate of Experimental Example 2C is 0.181, and the blue y-coordinate of Experimental Example 2D is 0.188.

As described above, it can be seen that, when the thickness of the second electrode as the cathode is 20 nm, the transmittance, the luminous efficiency, the driving voltage and the color coordinate are improved as the doping concentration of NaF is decreased. The doping concentration of NaF is 2% to 10%, preferably 2% to 5%.

Next, characteristics of the light emitting diode according to the doping concentration will be described when the thickness of the second electrode is 10 nm.

(6) EXPERIMENTAL EXAMPLE 1 (EXP1)

As mentioned above, the cathode of 10 nm was formed by depositing a 1:1 ratio of Mg:Ag doped with 2% NaF.

(7) EXPERIMENTAL EXAMPLE 1A (EXP1A)

A cathode of 10 nm was formed by depositing a 1:1 ratio of Mg:Ag doped with 3% NaF.

(8) EXPERIMENTAL EXAMPLE 1B (EXP1B)

A cathode of 10 nm was formed by depositing a 1:1 ratio of Mg:Ag doped with 5% NaF.

(9) EXPERIMENTAL EXAMPLE 1C (EXP1C)

A cathode of 10 nm was formed by depositing a 1:1 ratio of Mg:Ag doped with 7% NaF.

(10) EXPERIMENTAL EXAMPLE 1D (EXP1D)

A cathode of 10 nm was formed by depositing a 1:1 ratio of Mg:Ag doped with 10% NaF.

(11) Comparative Example (COM)

A cathode of 10 nm was formed by depositing a 1:1 ratio of Mg:Ag.

Figure 16:
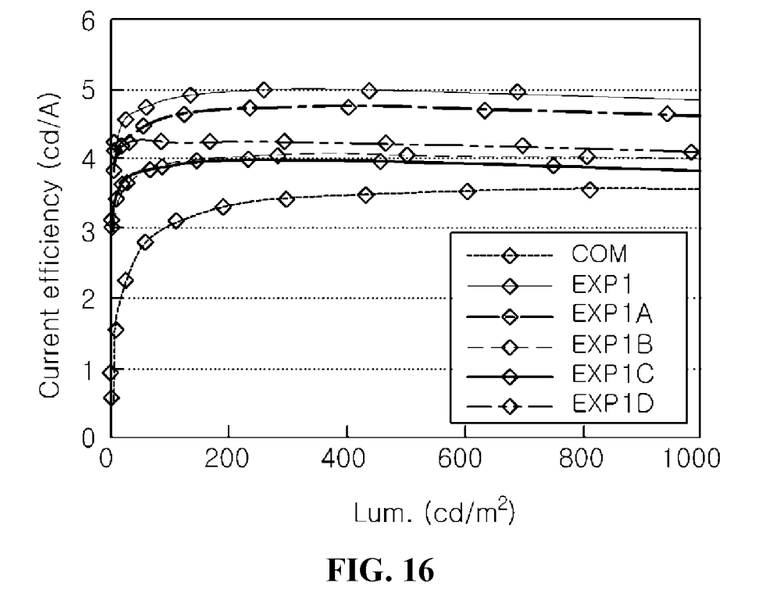
FIG. 16 is a graph illustrating the luminous efficiency characteristics of the light emitting diodes of Experimental Example 1 of the present disclosure according to the doping concentration.
Figure 17:
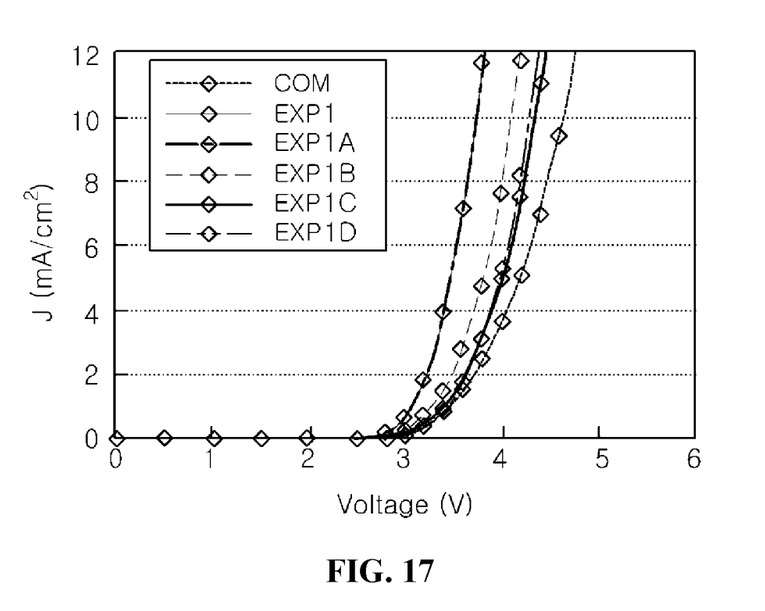
FIG. 17 is a graph illustrating voltage characteristics of the light emitting diodes of Experimental Example 1 according to the doping concentration.
Figure 18:
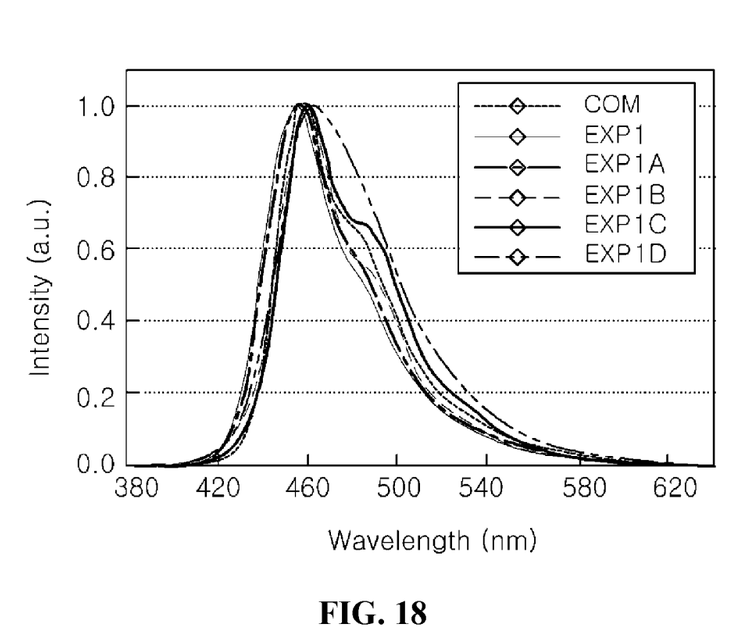
FIG. 18 is a graph illustrating the spectral characteristics of the light emitting diodes of Experimental Example 1 of the present disclosure according to the doping concentration.

FIGS. 16 to 18 show characteristics of light emitting diodes of Experimental Example 1 of the present disclosure according to the doping concentration. FIG. 16 is a graph illustrating the luminous efficiency characteristics of the light emitting diodes of Experimental Example 1 of the present disclosure according to the doping concentration. FIG. 17 is a graph illustrating voltage characteristics of the light emitting diodes of Experimental Example 1 according to the doping concentration. FIG. 18 is a graph illustrating the spectral characteristics of the light emitting diodes of Experimental Example 1 of the present disclosure according to the doping concentration.

As shown in FIG. 16, the average current efficiency of the light emitting diode of Experimental Example 1 is 4.8 cd/A, the average current efficiency of Experimental Example 1A is 4.5 cd/A, the average current efficiency of Experimental Example 1B is 4.0 cd/A, the average current efficiency of Experimental Example 1C is 3.8 cd/A, the average current efficiency of Experimental Example 1D is 3.8 cd/A, and the average current efficiency of Comparative Example is 3.6 cd/A.

Additionally, in FIG. 17, the driving voltage of the light emitting diode of Experimental Example 1 is 3.8 V, the driving voltage of Experimental Example 1A is 3.8 V, the driving voltage of Experimental Example 1B is 4.4 V, the driving voltage of Experimental Example 1C is 4.7 V, the driving voltage of Experimental Example 1D is 4.9 V, and the driving voltage of Comparative Example is 5.4 V.

Moreover, in FIG. 18, the blue y-coordinate of the light emitting diode of Experimental Example 1 is 0.114, the blue y-coordinate of Experimental Example 1A is 0.121, the blue y-coordinate of Experimental Example 1B is 0.142, the blue y-coordinate of Experimental Example 1C is 0.167, the blue y-coordinate of Experimental Example 1D is 0.182, and the blue y-coordinate of Comparative Example is 0.152.

As described above, it can be seen that, when the thickness of the second electrode as the cathode is 10 nm, the transmittance, the luminous efficiency, the driving voltage and the color coordinate are improved as the doping concentration of NaF is decreased. The doping concentration of NaF is 2% to 10%, preferably 2% to 5%.

In the embodiment of the present disclosure, the electron injection characteristics of the light emitting diode can be improved by adding a doping of the second metal or metal compound having the refractive index of 1.3 or more into the first metal to form the second electrode as the cathode. In one embodiment the index of refraction is between 1.3 and 2.0. In another embodiment, the refractive index of the second metal material is less than 1.5. In yet another embodiment, it is preferably between 1.3 and 1.4.

Thus, the transmittance is increased, and the luminous efficiency can be improved. The color coordinate is improved, and the color characteristics can be increased. In addition, the driving voltage can be decreased.

Moreover, since the electron transporting layer and the electron injecting layer are omitted, the structure of the light emitting diode can be simplified. Therefore, the manufacturing processes and costs can be reduced.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display device comprising:
a first electrode;
a hole auxiliary layer on the first electrode;
a light emitting material layer on the hole auxiliary layer;
a capping layer on the light emitting material layer; and
a single-layer second electrode between the capping layer and the light emitting layer, the single-layer second electrode being on and in direct contact with the light emitting material layer and the capping layer,
the single-layer second electrode including a first metal that is doped with a second metal material, the second metal material having a refractive index of 1.4 or higher,
wherein a content of the second metal material is within the range of about 2% to 5% of a content of the first metal by weight;
wherein the first metal includes an alloy of magnesium and silver;
wherein a content of silver is equal to or more than a content of magnesium; and
wherein a content ratio of magnesium and silver is within a range of 1:1 to 1:5.

2. The electroluminescent display device of claim 1, wherein the second metal material is selected from the group comprising lithium fluoride, cesium fluoride, sodium fluoride and barium.

3. The electroluminescent display device of claim 1, wherein a thickness of the single-layer second electrode is 20 nm or less.

4. The electroluminescent display device of claim 1, wherein light emitted from the light emitting material layer is outputted to an outside through the single-layer second electrode.

5. The electroluminescent display device of claim 1 wherein the second metal material contains only metal.

6. The electroluminescent display device of claim 1 wherein the second metal material contains a metal alloy.

7. The electroluminescent display device of claim 1 wherein the second metal material contains a metal compound.

8. The electroluminescent display device of claim 1 the second metal material contains a metal/nonmetal compound.

9. The electroluminescent display device of claim 1, wherein the light emitting material layer includes a red light emitting material layer corresponding to a red pixel region, a green light emitting material layer corresponding to a green pixel region, and a blue light emitting material layer corresponding to a blue pixel region, wherein a light emitting diode is disposed in each of red, green and blue pixel regions, and the light emitting diodes in the red, green and blue pixel regions have different thicknesses from each other, and wherein the light emitting diodes in the red and green pixel regions have thicknesses corresponding to a first order cavity condition, and the light emitting diode in the blue pixel region has a thickness corresponding to a second order cavity condition.

10. An electroluminescent display device comprising:
a first electrode;
a hole auxiliary layer on the first electrode;
a light emitting material layer on the hole auxiliary layer; and
a single-layered second electrode on and in direct contact with the light emitting material layer, the single-layered second electrode including a first metal that is doped with a second metal material in an amount of between about 2% and 5% by weight of a content of the first metal,
wherein the second metal material has a refractive index of 1.4 or higher,
wherein the first metal includes an alloy of magnesium and silver, and a content of silver is equal to or more than a content of magnesium; and
wherein a content ratio of magnesium and silver is within a range of 1:1 to 1:5.

11. The electroluminescent display device of claim 10, wherein the second metal material is selected from the group comprising lithium fluoride, cesium fluoride, sodium fluoride and barium.

12. The electroluminescent display device of claim 1, wherein the first metal includes an alloy of magnesium and silver and the second metal material includes sodium fluoride.

13. The electroluminescent display device of claim 1, wherein the single-layer second electrode includes silver, and the single-layer second electrode including silver is in direct contact with the light emitting material layer.

14. The electroluminescent display device of claim 1, wherein the second metal material has a LUMO value less than −2.5 eV.

15. The electroluminescent display device of claim 10, wherein the second metal material has a LUMO value less than −2.5 eV.

16. The electroluminescent display device of claim 10, wherein the light emitting material layer includes a red light emitting material layer corresponding to a red pixel region, a green light emitting material layer corresponding to a green pixel region, and a blue light emitting material layer corresponding to a blue pixel region, wherein a light emitting diode is disposed in each of red, green and blue pixel regions, and the light emitting diodes in the red, green and blue pixel regions have different thicknesses from each other, and wherein the light emitting diodes in the red and green pixel regions have thicknesses corresponding to a first order cavity condition, and the light emitting diode in the blue pixel region has a thickness corresponding to a second order cavity condition.

* * * * *